United States Patent [19]
Gardner et al.

[11] Patent Number: 6,100,173
[45] Date of Patent: Aug. 8, 2000

[54] FORMING A SELF-ALIGNED SILICIDE GATE CONDUCTOR TO A GREATER THICKNESS THAN JUNCTION SILICIDE STRUCTURES USING A DUAL-SALICIDATION PROCESS

[75] Inventors: Mark I. Gardner, Cedar Creek; H. Jim Fulford, Jr.; Charles E. May, both of Austin, all of Tex.

[73] Assignee: Advanced Micro Devices, Inc., Sunnyvale, Calif.

[21] Appl. No.: 09/116,066

[22] Filed: Jul. 15, 1998

[51] Int. Cl.$^7$ .................................................. H01L 21/3205
[52] U.S. Cl. .......................... 438/592; 438/555; 438/581; 438/582
[58] Field of Search ..................... 438/231, 305, 438/592, 688, 638, 655, 682, 581

[56] References Cited

U.S. PATENT DOCUMENTS

| | | | |
|---|---|---|---|
| 5,496,750 | 3/1996 | Moslehi | 438/305 |
| 5,604,138 | 2/1997 | Lee et al. | 438/307 |
| 5,739,573 | 4/1998 | Kawaguchi | 257/384 |
| 5,798,278 | 8/1998 | Chan et al. | 438/638 |

*Primary Examiner*—David Nelms
*Assistant Examiner*—Reneé R. Berry
*Attorney, Agent, or Firm*—Kevin L. Daffer; Conley, Rose & Tayon

[57] ABSTRACT

An integrated circuit fabrication process is provided for using a dual salicidation process to form a silicide gate conductor to a greater thickness than silicide structures formed upon source and drain regions of a transistor. A high K gate dielectric residing between the gate conductor and the substrate substantially inhibits consumption of the junctions during the formation of the silicide gate conductor. In an embodiment, a relatively thick layer of refractory metal is deposited across a transistor arranged upon and within a silicon-based substrate. The transistor includes a polysilicon gate conductor arranged upon a portion of a high K gate dielectric interposed between a pair of source and drain junctions. The refractory metal is heated to convert the polysilicon gate conductor to a silicide gate conductor. After removing the gate dielectric from the source and drain regions, a relatively thin layer of refractory metal is deposited across the topography and heated to form silicide structures upon the source and drain regions.

19 Claims, 4 Drawing Sheets

FORMING A SELF-ALIGNED SILICIDE GATE CONDUCTOR TO A GREATER THICKNESS THAN JUNCTION SILICIDE STRUCTURES USING A DUAL-SALICIDATION PROCESS

BACKGROUND OF THE INVENTION

1. Field of the Invention

This invention relates to integrated circuit fabrication and, more particularly, to a dual salicidation process which can form a silicide gate conductor having a greater thickness than silicide structures formed upon source and drain regions. A high K gate dielectric residing between the gate conductor and the substrate substantially inhibits consumption of the junctions during formation of the silicide gate conductor.

2. Description of the Related Art

Fabrication of an integrated circuit involves numerous processing steps. After impurity regions have been placed into a semiconductor substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is generally described as "metallization". As the complexity of integrated circuits has increased, the complexity of the metallization composition has also increased. Conductive materials other than metal are commonly used for metallization. As such, the term metallization is generic in its application.

Integrated circuits often employ active devices known as transistors. A transistor includes a pair of impurity regions, i.e., junctions, spaced apart by a gate conductor. The gate conductor is dielectrically spaced above a semiconductor substrate within which the junctions reside. The junctions contain dopants which are opposite in type to the dopants residing within a channel region of the substrate interposed between the junctions. The gate conductor typically comprises polycrystalline silicon ("polysilicon") which is rendered conductive by implanting dopants therein. Polysilicon can withstand relatively high temperatures. Therefore, a polysilicon gate conductor may be formed prior to performing high-temperature anneal steps, such as the post-implant anneal of the junctions. As such, the gate conductor may be patterned before the source and drain junctions are formed and annealed. In fact, the gate conductor is commonly used as a channel region mask during the formation of the source and drain junctions. One of the disadvantages of using polysilicon as the gate conductor material, however, is that it has a significantly higher resistivity than metals, such as aluminum. The propagation delay of an integrated circuit employing a polysilicon gate conductor thus may be longer than desired. Consequently, the operational frequency that can be achieved by a circuit employing a polysilicon gate conductor is somewhat limited.

The formation of ohmic contacts through an interlevel dielectric involves using a technique known as lithography to pattern a protective mask (i.e., photoresist) upon areas of the dielectric exclusive of where the contacts are to be formed. The areas of the interlevel dielectric left uncovered by the mask are then etched to form openings or "windows" through the interlevel dielectric to underlying junctions and gate conductors. The contact windows are filled with a conductive material to complete formation of the contacts. Unfortunately, the mask may be misaligned relative to the underlying topography during the lithography process. Accordingly, the contacts may be shifted from their targeted positions directly above the junctions and the gate conductors. As a result of the misalignment, the contact/junction and contact/gate conductor interfaces may experience increased contact resistances. The parasitic series resistances of the source and drain contact structures thus may be high enough to detrimentally affect the drive current of transistors employed by the integrated circuit.

To reduce the contact resistances at the contact/junction and contact/gate conductor interfaces, self-aligned low resistivity structures are commonly placed between the ohmic contacts and the junctions/gate conductors. The presence of these so-called self-aligned silicides (i.e., salicides) upon the junctions and gate conductors ensures that contact is made to the entire junction and gate areas. Further, forming salicide upon a polysilicon gate conductor helps lower the sheet resistance of the gate conductor. Salicide formed upon polysilicon is generally referred to as polycide. A salicide process involves depositing a refractory metal across the semiconductor topography, and then reacting the metal only in regions where a high concentration of silicon atoms are present. In this manner, salicides may be formed exclusively upon the junctions and the upper surfaces of polysilicon gate conductors. The sidewall surfaces which bound the gate conductors may be pre-disposed with dielectric sidewall spacers. The sidewall spacers serve to prevent the refractory metal from contacting, and hence reacting with, the polysilicon at the sidewall surfaces of the gate conductor. Absent the sidewall spacers, silicide could form upon the sidewall surfaces of the silicon-based gate conductors, undesirably shorting the gate conductors to adjacent junctions.

Transistor device dimensions have been continuously reduced to accommodate the high demand for faster, more complex integrated circuits. As such, the source and drain junction depths have been reduced. Unfortunately, a salicide may completely consume a relatively shallow junction and penetrate into the substrate underneath the junction, a phenomenon known as "junction spiking". Junction spiking may undesirably cause the junction to exhibit large current leakage or become electrically shorted. Therefore, in order to prevent excessive consumption of shallow junctions during contact formation, the junction salicide can only be of limited thickness. Since the gate and junction salicides are formed at the same time, the gate salicide also has a limited thickness. However, it is desirable to form a relatively thick layer of salicide upon a gate conductor to lower the sheet resistance of the gate conductor. Accordingly, it would be of benefit to develop a salicidation process in which the junction salicides and the gate salicides have dissimilar thicknesses. That is, the salicidation process must no longer require concurrent formation of the junction salicides and the gate salicides.

SUMMARY OF THE INVENTION

The problems outlined above are in large part solved by the technique hereof for forming a silicide gate conductor self-aligned between a pair of source and drain junctions arranged within a semiconductor substrate beneath the gate conductor. A gate dielectric having a dielectric constant, K, greater than approximately 4 (i.e., the K value of silicon dioxide) is arranged between the gate conductor and the substrate. The thickness of the gate dielectric remains over the junctions and is sufficiently thick to substantially inhibit a thick layer of refractory metal deposited thereon from contacting the junctions during the formation of the silicide gate conductor. As such, the entire thickness of the gate conductor may be converted from polysilicon to salicide without being concerned that junction spiking might occur. The silicide gate conductor advantageously has an extremely low sheet resistance, and thus affords high-frequency operation of an ensuing integrated circuit.

The dielectric constant of a material is the permittivity of the material normalized to the permittivity of a vacuum. The permittivity of a material reflects the ability of the material to be polarized by an electric field. Therefore, capacitance between two layers of conductive material separated by a dielectric is directly proportional to the permittivity of the dielectric and the thickness of the dielectric. Relatively thin gate dielectrics tend to experience breakdown when subjected to an electric field. As a result of the breakdown of a gate dielectric, a tunneling current may inadvertently flow between the gate conductor and the channel region of the substrate. Therefore, using a thicker gate dielectric having a relatively high K value advantageously affords increased capacitive coupling between the gate conductor and the substrate while avoiding dielectric breakdown. The threshold voltage, $V_T$, of the transistor subsequently formed from the gate dielectric is thus reduced, further increasing the speed of the ensuing integrated circuit. Also, the thicker gate dielectric proves advantageous over the junctions in that it prevents salicidation of the underlying junctions.

Subsequent to forming the silicide gate conductor, the gate dielectric may be removed from heavily doped source and drain regions of the junctions which are laterally separated from the gate conductor by a pair of dielectric sidewall spacers. A thin layer of refractory metal is then deposited across the exposed source and drain regions. Salicide structures may be formed upon the source and drain regions by heating the refractory metal. Using a relatively thin layer of metal to form the salicide structures ensures that only a small portion of the source and drain regions are consumed. Forming the silicide gate conductor and the junction salicide during separate salicidation steps allows the thickness of the gate salicide to be much larger than that of the junction salicide. As such, using a dual salicidation process provides for the formation of a low resistivity gate conductor while avoiding excessive consumption of the source and drain regions.

According to an embodiment, a method is provided for forming an integrated circuit. A polysilicon gate conductor having a thickness of, e.g., 200 to 500 Å, is first patterned upon a high K gate dielectric which is arranged across a single crystalline silicon substrate. The gate conductor is laterally bound between a pair of opposed sidewall surfaces. A lightly doped drain ("LDD") implant is self-aligned to the opposed sidewall surfaces of the gate conductor to form LDD areas within the substrate spaced apart by a channel region. The gate conductor serves as a mask above the underlying channel region during the LDD implant. The dopant species used for the LDD implant is opposite in type to the dopant species residing in the channel region. Thereafter, dielectric sidewall spacers comprising, e.g., silicon dioxide ("oxide"), may be formed upon the opposed sidewall surfaces of the gate conductor. A source/drain ("S/D") implant is then self-aligned to the outer lateral edges of the sidewall spacers. The S/D implant is performed using the same type of dopant species as that used for the LDD implant, but at a higher dose and energy than the LDD implant. Source and drain regions are thusly placed within the substrate a lateral spaced distance from the gate conductor. The LDD areas are only retained beneath the sidewall spacers.

A first layer of refractory metal, e.g., Ti or Co, may then be deposited across the topography. The thickness of the first layer of refractory metal may range from 300 to 800 Å. The first layer of refractory metal may be heated to promote cross-diffusion and reaction between the metal atoms and silicon atoms of the polysilicon gate conductor. The refractory metal may, for example, be heated to a temperature of 600 to 800° C. for approximately 15 to 60 seconds using a technique known as rapid thermal processing ("RTP"). In this manner, a silicide gate conductor comprising, e.g., $TiSi_2$ or $CoSi_2$ is self-aligned to the pre-existing polysilicon gate. The gate conductor is thus interposed between the previously implanted LDD areas. The gate dielectric residing upon the source and drain regions during this salicidation step is sufficiently thick to inhibit the metal atoms from coming in contact with the silicon-based substrate. As such, the gate dielectric provides a barrier against silicidation of the source and drain regions. Also, the dielectric sidewall spacers are thick enough to prevent silicide from forming upon the sidewall surfaces of the gate conductor. The unreacted metal is removed from the semiconductor topography after the formation of the low resistivity silicide gate conductor.

Subsequently, the gate dielectric is etched from the source and drain regions. A second layer of refractory metal, e.g., Ti or Co, having a thickness of, e.g., 100 Å, is deposited across the topography. The refractory metal is heated to promote a reaction between metal atoms and silicon atoms within the substrate. In this manner, silicide structures comprising, e.g., $TiSi_2$ or $CoSi_2$, are formed self-aligned to the source and drain regions. Since the second layer of refractory metal used to form the silicide structures is relatively thin, the resulting silicide structures are also thin. As such, only a small amount of the source and drain regions are consumed by this second salicidation step. The unreacted metal is then stripped from the topography to expose a transistor comprising a silicide gate conductor interposed between a pair of source and drain junctions. The junctions comprise LDD areas adjacent the gate conductor and source and drain regions outside the LDD areas. Silicide structures are arranged upon the source and drain regions. The silicide structures provide for lower contact resistances between the source and drain regions and contacts subsequently formed above the suicide structures.

BRIEF DESCRIPTION OF THE DRAWINGS

Other objects and advantages of the invention will become apparent upon reading the following detailed description and upon reference to the accompanying drawings in which.

Figure 1:
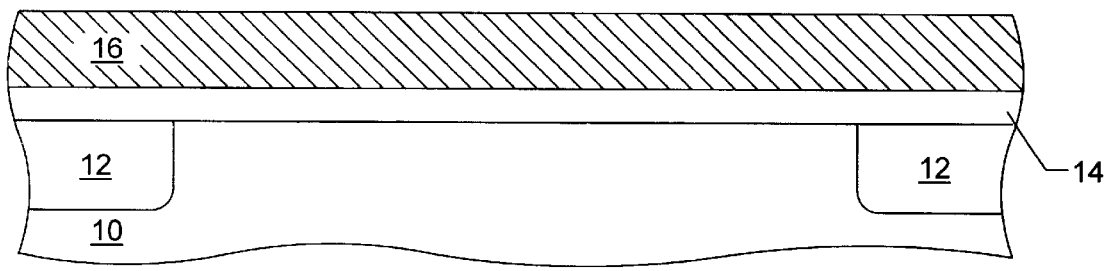
FIG. 1 depicts a partial cross-sectional view of a semiconductor topography in which a polysilicon gate conductor is spaced above a silicon-based substrate by a high K gate dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a semiconductor substrate 10 upon which a gate dielectric 14 and a polysilicon gate conductor 16 have been formed. Substrate 10 comprises single crystalline silicon which has been slightly doped with n-type or p-type impurities. Shallow trench isolation structures 12 are arranged a spaced distance apart within substrate 10 to isolate ensuing active areas. The shallow trench isolation structures may alternatively be replaced with LOCOS structures. Gate dielectric 14 is formed by the deposition of a material having a K value greater than approximately 4. The thickness of gate dielectric 14 ranges from about 100 to 500 Å. The higher the K value of gate dielectric 14, the thicker the gate dielectric needs to be to achieve the same capacitance. An appropriate material for the high K gate dielectric includes, but is not limited to, tantalum pentoxide ($Ta_2O_5$), barium titanate ($BaTiO_3$), titanium oxide ($TiO_2$), zirconium oxide ($ZrO_2$), barium zirconate ($BaZrO_3$), barium tungstate ($BaWO_4$), magnesium dioxide ($MnO_2$), magnesium tungstate ($MnWO_4$), strontium niobate ($Sr_2Nb_2O_7$), tungsten trioxide ($WO_3$), zinc tungstate ($ZnWO_4$) yttrium sesqeioxide ($Y_2O_3$), strontium tungstate ($SrWO_4$), and strontium titanate ($SrTiO_3$). Gate conductor 16 comprises polysilicon which has been deposited by chemical-vapor deposition ("CVD") from, e.g., a silane source. Gate conductor 16 may be, e.g., 200 to 500 Å thick.

Figure 2:
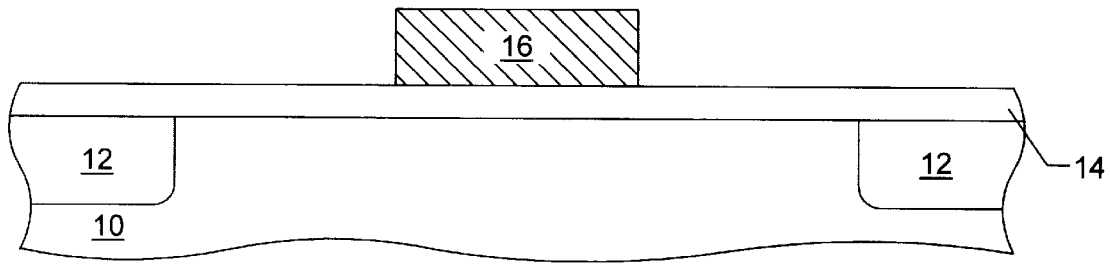
FIG. 2 depicts a partial cross-sectional view of the semiconductor topography, wherein portions of the gate conductor are etched from the gate dielectric to define a pair of opposed sidewall surfaces which bound the gate conductor, subsequent to the step in FIG. 1.
Figure 3:
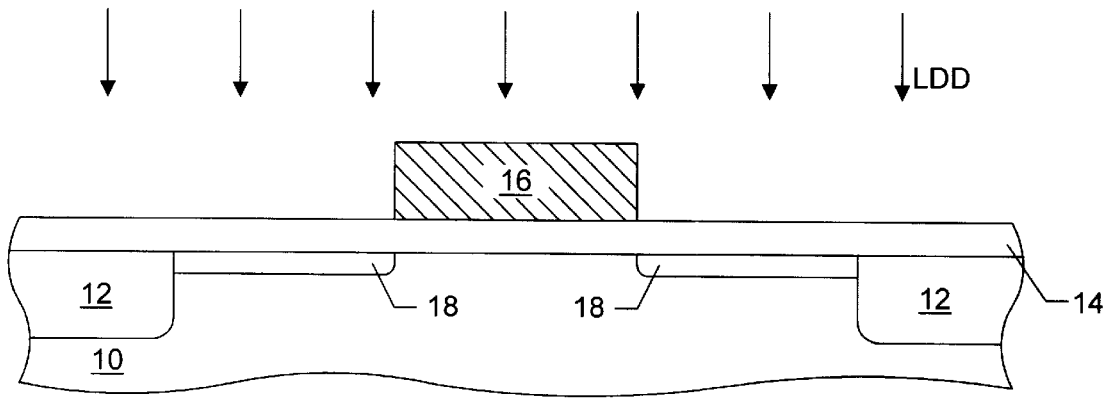
FIG. 3 depicts a partial cross-sectional view of the semiconductor topography, wherein an LDD implant is self-aligned to the opposed sidewall surfaces of the gate conductor to form LDD areas within the substrate, subsequent to the step in FIG. 2.

As shown in FIG. 2, select portions of gate conductor 16 may be removed using well-known lithography and etch techniques. Preferably, a plasma etch is used to remove those portions of gate conductor 16. The plasma etch duration is selected to terminate before substantial portions of gate dielectric 14 are removed. As a result of the etch, substantially vertical sidewall surfaces are defined at the lateral boundaries of gate conductor 16. FIG. 3 illustrates the formation of source-side and drain-side LDD area 18. LDD areas 18 are formed by self-aligning an LDD implant to the opposed sidewall surfaces of gate conductor 16. The formation of an NMOS transistor requires an LDD implant of n-type dopants, and the formation of a PMOS transistor requires an LDD implant of p-type dopants. Appropriate n-type species include, but are not limited to, arsenic and phosphorus, and appropriate p-type species include, but are not limited to, boron and boron difluoride. It is to be understood that both NMOS and PMOS transistors may be formed within a unitary substrate to form a CMOS circuit by masking the ensuing NMOS active areas while implanting p-type dopants into the ensuing PMOS active areas, and vice-versa.

Figure 4:
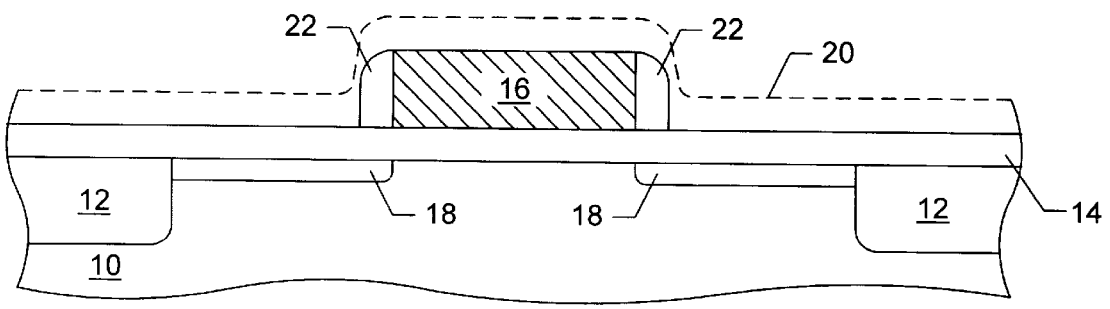
FIG. 4 depicts a partial cross-sectional view of the semiconductor topography, wherein a pair of dielectric sidewall spacers are formed upon the opposed sidewall surfaces of the gate conductor, subsequent to the step in FIG. 3.
Figure 5:
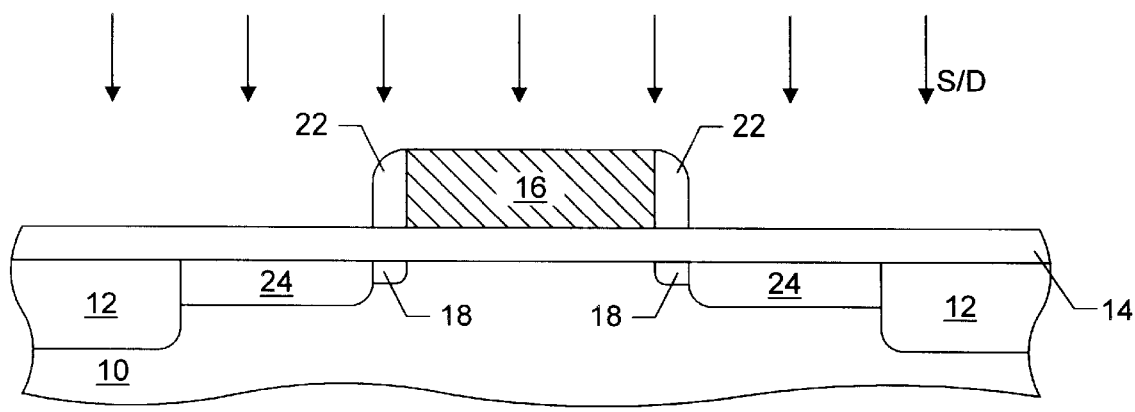
FIG. 5 depicts a partial cross-sectional view of the semiconductor topography, wherein a source/drain implant is self-aligned to the outer lateral edges of the sidewall spacers to form source and drain regions laterally spaced from the gate conductor, subsequent to the step in FIG. 4.
Figure 6:
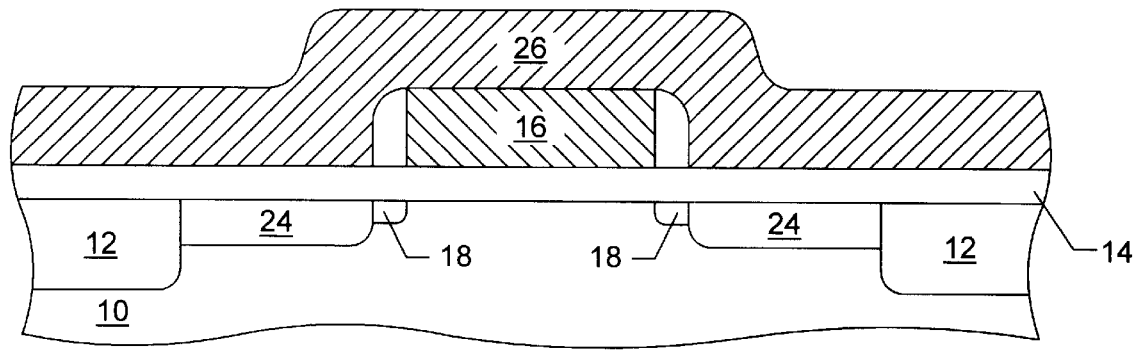
FIG. 6 depicts a partial cross-sectional view of the semiconductor topography, wherein a first layer of refractory metal is deposited across the topography, subsequent to the step in FIG. 5.
Figure 7:
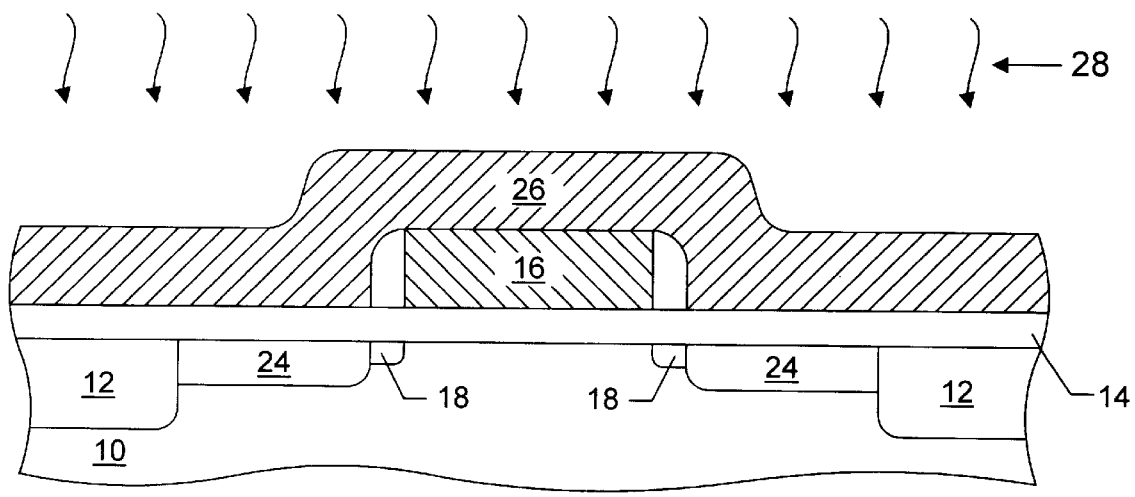
FIG. 7 depicts a partial cross-sectional view of a semiconductor topography, wherein the first layer of refractory metal is heated to convert the polysilicon gate conductor to a silicide gate conductor, subsequent to the step in FIG. 6.

Turning to FIG. 4, a pair of dielectric sidewall spacers 22 are formed upon the opposed sidewall surfaces of gate conductor 16. The formation of sidewall spacers 22 involves first depositing a dielectric material comprising, e.g., oxide or silicon nitride, across the topography, as indicated by dotted line 20. The horizontally oriented surfaces of the dielectric material is then anisotropically etched at a faster rate than vertically oriented surfaces. As a result of the etch, the dielectric material is only retained laterally adjacent the sidewalls surfaces of gate conductor 16 in the form of sidewall spacers 22. The lateral thickness of each sidewall spacer 22 may be controlled by altering the deposition time of the dielectric material. As shown in FIG. 5, a S/D implant is then performed at a higher dose and energy than the LDD implant. The S/D implant is self-aligned to the outer lateral surfaces of sidewall spacers 22. In this manner, source and drain regions 24 are formed within substrate 10 a spaced distance from gate conductor 16. As such, LDD areas 18, which contain a lighter concentration of dopant than source and drain regions 24, only remain in the lateral areas beneath sidewall spacers 22. Together, LDD areas 18 and source and drain regions 24 form graded junctions which increase in concentration in a lateral direction away from gate conductor 16.

Figure 8:
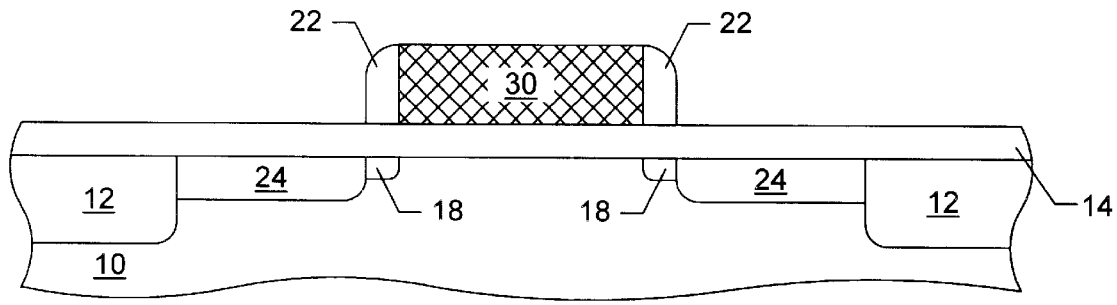
FIG. 8 depicts a partial cross-sectional view of the semiconductor topography, wherein unreacted metal has been removed from the topography to reveal a silicide gate conductor self-aligned between a pair of LDD areas, subsequent to the step in FIG. 7.

Thereafter, a first layer of refractory metal 26 is deposited across exposed surfaces of gate dielectric 14, sidewall spacers 22, and gate conductor 16. The refractory metal may be sputter deposited from a metal target or MOCVD (i.e., metal organic CVD) deposited from a source comprising a volatile metal organic compound. The first layer of refractory metal 26 may be, e.g., approximately 300 to 800 Å thick. Appropriate refractory metals include, but are not limited to, cobalt and titanium. The first layer of refractory metal 26 may subjected to radiation 28 to cause the metal atoms of the first layer of refractory metal 26 to undergo cross-diffusion and reaction with silicon atoms within polysilicon gate conductor 16. Radiation 28 may be thermal radiation supplied from an anneal furnace. Preferably, radiation 28 is radiant light supplied from e.g., an arc lamp or a tungsten-halogen lamp using RTP. The RTP may be performed for approximately 15 to 60 seconds at a temperature of 600 to 800° C. The presence of the relatively thick gate dielectric 14 above source and drain regions 24 inhibits the metal atoms from interacting with silicon atoms arranged within substrate 10. As a result of the anneal step, a majority of polysilicon gate conductor 24 may be converted into a silicide gate conductor 30, as shown in FIG. 8. Over 80% of the thickness of gate conductor 30 may be consumed by the metal silicide. It is even possible for more than 90% of gate conductor 30 to be consumed by the metal silicide. The excess refractory metal not consumed during this salicidation process is removed using a selective etch technique. The resulting silicide gate conductor 30 comprises $TiSi_2$ if Ti is used as the refractory metal and $CoSi_2$ if Co is used as the refractory metal.

Figure 9:
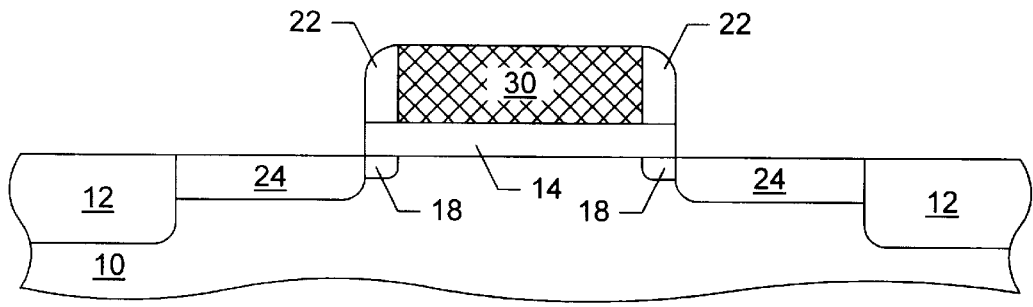
FIG. 9 depicts a partial cross-sectional view of the semiconductor topography, wherein the gate dielectric is removed from the source and drain regions, subsequent to the step in FIG. 8.
Figure 10:
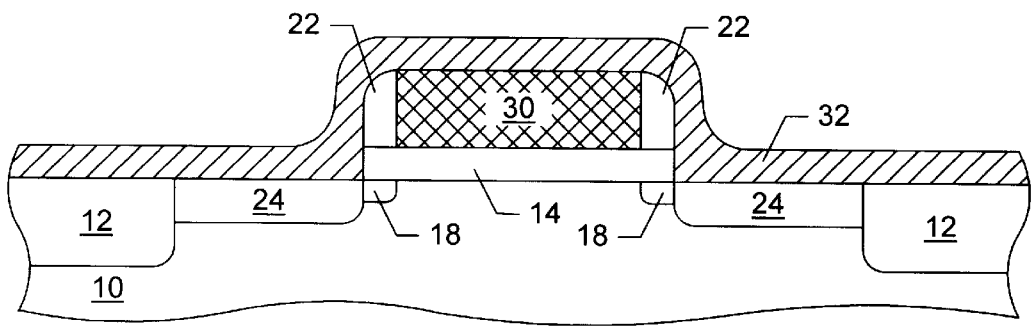
FIG. 10 depicts a partial cross-sectional view of the semiconductor topography, wherein a second layer of refractory metal which is substantially thinner than the first layer of refractory metal is deposited across the topography, subsequent to the step in FIG. 9.
Figure 11:
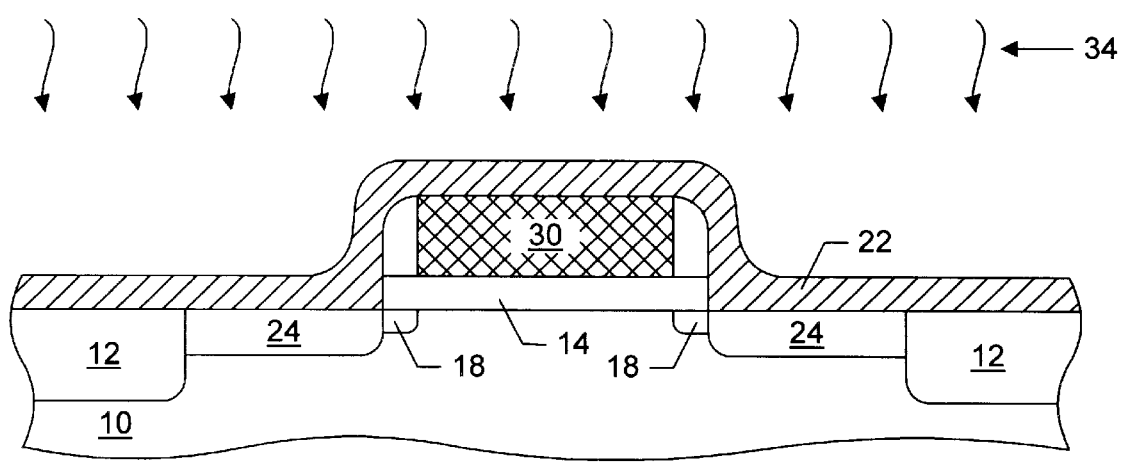
FIG. 11 depicts a partial cross-sectional view of the semiconductor topography, wherein the second layer of refractory metal is heated to promote a reaction between silicon atoms within the source and drain regions and metal atoms within the second layer of refractory metal, subsequent to the step in FIG. 10.
Figure 12:
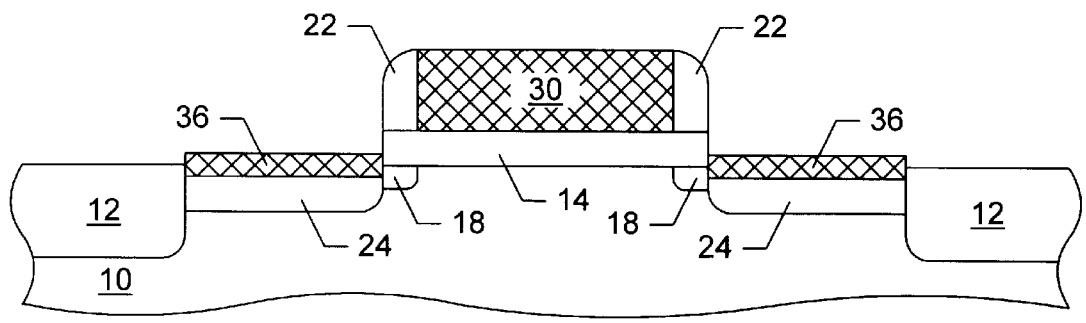
FIG. 12 depicts a partial cross-sectional view of the semiconductor topography, wherein silicide structures are formed upon the source and drain regions and unreacted metal is removed from the topography, subsequent to the step in FIG. 11.

Turning to FIG. 9, gate dielectric 14 may then be removed from source and drain regions 24 using, e.g., a plasma etch technique which exhibits a high selectivity for the gate dielectric material. A non-selective plasma etch technique may alternatively be used if a protective photoresist layer is patterned upon gate conductor 30 and sidewall spacers 22. Subsequent to exposing source and drain regions 24, a second layer of refractory metal 32, e.g., titanium or cobalt, may be then be deposited across the semiconductor topography. The second layer of refractory metal 32 is substantially thinner than the first layer of refractory metal 26. For example, the second layer of refractory metal 32 may be approximately 100 Å thick. As shown in FIG. 11, the topography may then be exposed to radiation 34 to heat the second layer of refractory metal 32. The topography may be heated to approximately 600 to 800° C. for 15 to 60 seconds using an RTP technique. As a result of being annealed, metal atoms within the second layer of refractory metal 32 may react within underlying Si atoms of substrate 10. In this manner, silicide structures 36 comprising, e.g., $TiSi_2$ or $CoSi_2$, are formed upon source and drain regions 36, as shown in FIG. 12. Any unreacted refractory metal may be selectively etched away. Using a two-step salicidation process to form silicide gate conductor 16 and silicide structures 36 ensures that excessive consumption of source and drain regions 24 does not occur during the formation of silicide gate conductor 30. An interlevel dielectric may be subsequently deposited across the topography, followed by the formation of conductive plugs to the silicide gate conductor 30 and the silicide structures 36 residing upon the source and drain regions.

In the instance that silicide structures 36 and silicide gate conductor 30 comprise $TiSi_2$, sidewall spacers 22 are preferably composed of silicon nitride ("nitride") as opposed to oxide. The reactivity of Ti with $SiO_2$ to form both $TiSi_2$ and $TiO_2$ is relatively high, and can undesirably lead to the formation of an electrical short between gate conductor 30 and source and drain regions 24. However, the reaction between Ti and $Si_3N_4$ is less favorable. As such a silicide bridge is less likely to form upon nitride spacers than upon oxide spacers. Fabricating sidewall spacers 22 from oxide is possible if the spacer thickness is sufficient to prevent $TiSi_2$ from forming immediately adjacent the sidewall spacers of the gate conductor. Because Co does not readily react with oxide or nitride, relatively thin sidewall spacers 22 composed of either nitride or oxide may be used if $CoSi_2$ is being formed.

It will be appreciated to those skilled in the art having the benefit of this disclosure that this invention is believed to provide a method for forming a self-aligned silicide gate conductor to a greater thickness than silicide structures subsequently formed upon source and drain regions. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
   providing a gate dielectric arranged across a semiconductor substrate comprising a source junction laterally spaced from a drain junction by a channel region, and a polysilicon gate conductor spaced above the channel region by the gate dielectric, wherein the polysilicon gate conductor is arranged laterally between a pair of dielectric sidewall spacers;
   depositing a first layer of refractory metal across exposed surfaces of the gate dielectric, the sidewall spacers, and the gate conductor; and
   heating the first layer of refractory metal to convert the polysilicon gate conductor to a silicide gate conductor, wherein the entire gate conductor comprises silicide, and wherein the gate dielectric comprises a thickness sufficient to substantially inhibit silicide from forming upon the source and drain junctions.

2. The method of claim 1, further comprising removing unreacted refractory metal from the gate dielectric and the sidewall spacers.

3. The method of claim 2, wherein the source and drain junctions comprise lightly doped drain areas beneath the sidewall spacers and heavily doped source and drain regions outside the lightly doped drain areas.

4. The method of claim 3, further comprising removing the gate dielectric from the heavily doped source and drain regions.

5. The method of claim 4, further comprising depositing a second layer of refractory metal across the heavily doped source and drain regions, the sidewall spacers, and the silicide gate conductor.

6. The method of claim 5, further comprising heating the second layer of refractory metal to form silicide structures upon the heavily doped source and drain regions.

7. The method of claim 1, wherein the gate dielectric comprises a material having a dielectric constant greater than approximately 4.

8. The method of claim 1, wherein the polysilicon gate conductor is approximately 200 to 500 Å thick.

9. The method of claim 8, wherein the first layer of refractory metal is approximately 300 to 800 Å thick.

10. The method of claim 9, wherein the second layer of refractory metal is approximately 100 Å thick.

11. The method of claim 1, wherein the gate dielectric comprises a high K dielectric selected from the group consisting of tantalum pentoxide, titanium dioxide, zirconium dioxide, barium titanate, barium zirconate, barium tungstate, magnesium dioxide, strontium niobate, tungsten trioxide, zinc tungstate, yttrium sesqeioxide, strontium tungstate, and strontium titanate.

12. The method of claim 1, wherein the refractory metal comprises a metal selected from the group consisting of titanium and cobalt.

13. A method for forming an integrated circuit, comprising:
- providing a gate dielectric arranged across a semiconductor substrate comprising a source junction laterally spaced from a drain junction by a channel region, and a polysilicon gate conductor spaced above the channel region by the gate dielectric, wherein the polysilicon gate conductor is arranged laterally between a pair of dielectric sidewall spacers, and wherein the gate dielectric comprises a material having a dielectric constant greater than approximately 4;
- depositing a first layer of refractory metal across exposed surfaces of the gate dielectric, the sidewall spacers, and the gate conductor;
- heating the first layer of refractory metal to convert the polysilicon gate conductor to a silicide gate conductor, wherein the gate dielectric comprises a thickness sufficient to substantially inhibit silicide from forming upon the source and drain junctions; and
- removing unreacted refractory metal from the gate dielectric and the sidewall spacers.

14. The method of claim 13, wherein the source and drain junctions comprise lightly doped drain areas beneath the sidewall spacers and heavily doped source and drain regions outside the lightly doped drain areas.

15. The method of claim 14, further comprising removing the gate dielectric from the heavily doped source and drain regions.

16. The method of claim 15, further comprising depositing a second layer of refractory metal across the heavily doped source and drain regions, the sidewall spacers, and the silicide gate conductor.

17. The method of claim 16, further comprising heating the second layer of refractory metal to form silicide structures upon the heavily doped source and drain regions.

18. The method of claim 13, wherein the gate dielectric comprises a material selected from the group consisting of tantalum pentoxide, titanium dioxide, zirconium dioxide, barium titanate, barium zirconate, barium tungstate, magnesium dioxide, strontium niobate, tungsten trioxide, zinc tungstate, yttrium sesqeioxide, strontium tungstate, and strontium titanate.

19. The method of claim 13, wherein the refractory metal comprises a metal selected from the group consisting of titanium and cobalt.

* * * * *